United States Patent [19]

Crivello et al.

[11] Patent Number: 5,346,803
[45] Date of Patent: Sep. 13, 1994

[54] PHOTORESIST COMPOSITION COMPRISING A COPOLYMER HAVING A DI-T-BUTYL FUMARATE

[75] Inventors: James V. Crivello, Clifton Park; Sang-Yeon Shim, Troy, both of N.Y.

[73] Assignee: Shin-Etsu Chemical Co., Ltd., Tokyo, Japan

[21] Appl. No.: 121,410

[22] Filed: Sep. 15, 1993

[51] Int. Cl.$^5$ .............................................. G03F 7/004
[52] U.S. Cl. .................................. 430/270; 430/165; 430/189; 430/192; 430/326; 430/330; 430/910; 430/921; 430/925; 430/945
[58] Field of Search .............. 430/270, 192, 326, 193, 430/191, 165, 189, 910, 921, 925, 945, 330

[56] References Cited

U.S. PATENT DOCUMENTS

| | | | |
|---|---|---|---|
| 4,678,737 | 7/1987 | Schneller et al. | 430/270 |
| 5,068,168 | 11/1991 | Lee | 430/192 |
| 5,238,781 | 8/1993 | Shadeli et al. | 430/270 |
| 5,252,427 | 10/1993 | Bauer et al. | 430/270 |

Primary Examiner—Charles L. Bowers, Jr.
Assistant Examiner—John S. Chu
Attorney, Agent, or Firm—Millen, White, Zelano, & Branigan

[57] ABSTRACT

A photoresist composition comprises a polymer of the following formula (1):

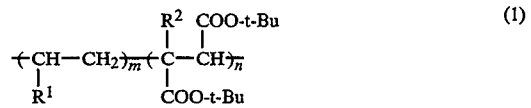

wherein $R^1$ is a substituted or unsubstituted aromatic group or $-(CH_2)_p-SiR^3$ wherein $R^3$ is a methyl or ethyl group and p is equal to 0 or 1, $R^2$ is a hydrogen atom or methyl group, t-Bu is a tertiary-butyl group, and $n/(m+n)$ is in the range of from 0.1 to 0.9.

The polymer of formula (1) can form a positive working two-component photoresist composition with a photoacid generator. The polymer of formula (1) can also be used as an alkali soluble resin and in this regard, form a positive working three-component photoresist composition with a photoacid generator and a dissolution inhibitor having at least one group which is unstable to acid. Alternatively, the polymer of formula (1) can be used as a dissolution inhibitor and in this regard, form a positive working three-component photoresist composition with another alkali soluble resin and a photoacid generator.

16 Claims, No Drawings

PHOTORESIST COMPOSITION COMPRISING A COPOLYMER HAVING A DI-T-BUTYL FUMARATE

BACKGROUND OF THE INVENTION

1. Field of the Invention

This invention generally relates to a photoresist composition and more particularly, to a photoresist composition of the chemical amplification type suitable for forming fine patterns in the manufacture of super-large scale integrated microcircuits.

2. Prior Art

Photoresists are important materials for the fabrication of integrated circuits. These materials are employed for the transfer of a pattern onto a silicon wafer which allows the selective deposition and removal of materials necessary for the construction of the elements which become the circuit. Today, an important goal in integrated circuit fabrication consists of reducing the size of the discrete devices contained in an integrated circuit by as much as possible to incorporate as many devices as possible per unit area. In memory chips this means that a higher density of data can be stored in a smaller area and that ultimately, the size of the electronic device can be further reduced.

To achieve this goal, photoresists with higher sensitivities and resolution capabilities must be developed. Ultimately, the physics of the optics and the irradiating light which are used in imaging are the main limiting factors on the minimum size of the features which can be imaged. Based on these considerations, it has been found that the highest resolution in optical imaging is obtained using the shortest wavelengths of light. This implies that light in the deep ultraviolet region of the spectrum (i.e., 190–300 nm) must be employed to provide optimal resolution capabilities for the next generation of photoresists which are targeted at a feature size of 0.25–0.5 μm. At the present time, no adequate photoresists are commercially available which operate in this region. Similarly, the sensitivity of the photoresist should be less than 15 mJ/cm² since typically irradiation sources in the deep UV are relatively weak. To achieve good definition of the imaged patterns and to permit optimal etching and deposition processes, the photoresist should have as high a contrast as possible.

Considerable efforts are currently being expended to develop deep UV sensitive photo-resists which meet the above criteria. The most successful of these efforts have depended on the use of chemically amplified systems. By the term "chemical amplification" it is meant that the photoresist contains a photosensitive element which on irradiation releases a catalytic agent. The catalytic agent then induces a specifically desired image forming chain reaction that results in a photo-multiplication effect which increases the sensitivity. An example of this principle is shown in the equation below.

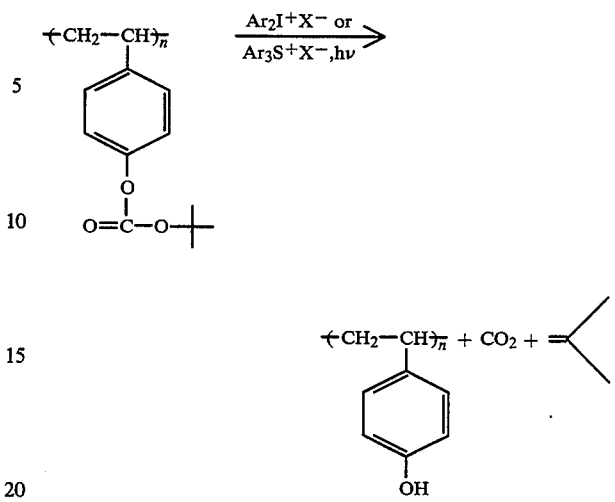

When poly(4-t-butoxycarbonyloxystyrene) is irradiated in the presence of either a diaryliodonium salt or a triarylsulfonium salt, an acid (HX) is produced from the salt which catalytically deblocks the polymer to give isobutylene and poly(4-hydroxystyrene). See H. Ito and C. G. Willson, "Polymers in Electronics", ACS Symp. Ser., 242, 11 (1984). Whereas the initial polymer is insoluble in aqueous basic solution, the deblocked polymer is very soluble in aqueous base. Thus, if films of poly(4-t-butoxycarbonyloxystyrene) are subjected to imagewise exposure through a mask, only those portions of the film which are exposed to light become soluble and are removed when immersed in aqueous base. In this way, a positive reproduction of the mask is obtained.

An additional example of a similar technology is shown in the following equation. See D. A. Conlon, J. V. Crivello, J. L. Lee and M. J. O'Brien, Macromolecules, 22, 509 (1989).

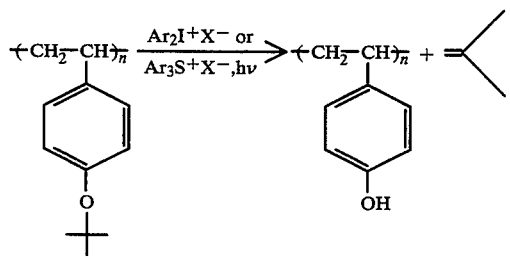

In this case, the poly(4-t-butoxy-styrene) is effectively and catalytically converted to the polyphenol by a small amount of acid generated from the photolysis of the onium salt. Again, the starting polymer is insoluble in aqueous base while the deblocked polymer is readily soluble. This system also may be considered a positive working photoresist.

The aforementioned photoresists based on poly(4-t-butoxycarbonyloxystyrene) and poly-(4-t-butoxystyrene) form the mainstream of chemical amplification type photoresist since they have high sensitivity. These photoresists are used in the deep UV region unlike conventional diazonaphthoquinone-novolak resins which are commonly used as photoresists for the 436 nm and 365 nm portions of the UV spectrum.

A number of positive working photoresist materials of the chemical amplification type heretofore proposed, however, suffer several problems which must be overcome before they can be used in practice. There is a need for improved positive working photoresist materials of the chemical amplification type.

SUMMARY OF THE INVENTION

An object of the present invention is to provide an improved photoresist composition which can be practically used as a two- or three-component photoresist.

There are four major criteria in the selection of polymer materials for use as deep UV photoresists. They are listed as follows:

1. The polymer must have as low an absorption as possible in the deep UV range of the spectrum. In particular, since the most advanced imaging sources are KrF ion excimer lasers which emit at 248 nm, the polymer should exhibit no or very little absorption at this wavelength.

2. The polymer must have a reasonably high glass transition temperature (Tg) which will allow it to be subjected to such processes as metallization without causing the image to be distorted due to viscoelastic flow.

3. The polymer must have good resistance to oxygen plasma because the photoresist must protect the underlying surface from attack by oxygen when it is used to form $SiO_2$ during subsequent IC fabrication steps.

4. Lastly, the polymer should possess functional groups which can be altered by photochemically generated catalysts. The changes which take place should produce sharp modifications in the solubility characteristics of the polymer in aqueous base.

Based on these considerations, we have begun to explore polymers and copolymers based on di-t-butylfumarate as a monomer. Poly(di-t-butylfumarate) was prepared for the first time by Otsu and his coworkers by the free radical polymerization of the monomer. See T. Otsu, T. Yasuhara, K. Shiraishi, and S. Mori, Polymer Bulletin, 12, 449 (1984).

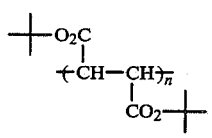

This polymer is very interesting in that it nearly transparent in the 248 nm region of the UV spectrum and shows a very high Tg (>200° C.). We observed that this polymer can be readily converted to the corresponding poly(fumaric acid) by photochemical deblocking of the t-butyl ester groups in the presence of diaryliodonium or triarylsulfonium salts as shown in the following equation.

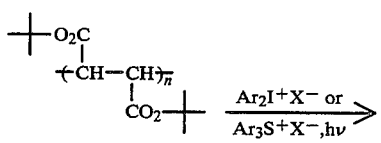

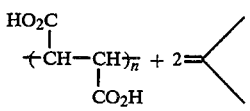

However, this polymer exhibits poor solubility characteristics and very poor etch resistance towards oxygen plasma (5447 Å/min., 100% $O_2$; 4282 Å/min., $CF_4$, 5% $O_2$). Hence, this polymer is useless as a deep UV photoresist. Accordingly, alternative approaches have been explored.

We have overcome the problem of oxygen etch resistance through the preparation of copolymers. Besides excellent oxygen plasma etch resistance, the polymers exhibit very good photosensitivity, resolution and contrast when used as deep UV photoresists. Two basic series of copolymers with di-t-butylfumarate were prepared; those based on allyltrimethylsilane and on styrene.

The copolymerizations of di-t-butylfumarate (DtBF) and allyltrimethylsilane (ATS) or styrene (ST) or 4-t-butoxy-styrene (BOST) can be carried out under typical free radical conditions as depicted in the following equations.

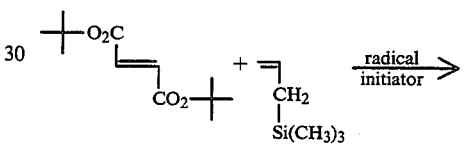

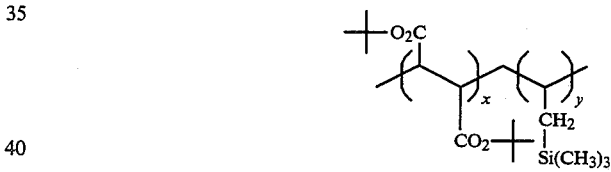

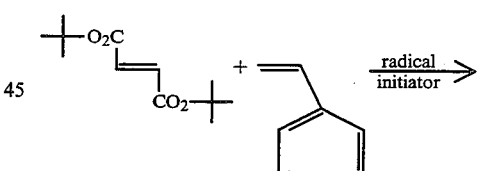

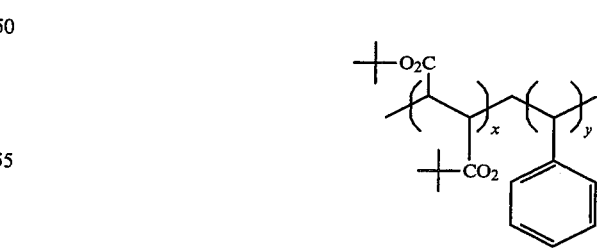

Through control of the amounts of free radical initiator, the molecular weights and molecular weight distributions of the copolymers can be controlled. Typically useful number average molecular weights lie in the range of 500 to 100,000 g/mol. Furthermore, by manipulation of the monomer ratios, considerable variation in the dissolution characteristics and ultimate resolution of the resulting photoresists can be obtained. Higher ratios of DtBF give rise to polymers with higher solubility after deblocking with aqueous base. Optimal ratios of the three monomers to DtBF (DtBF:ATS, DtBF:ST and DtBF:BOST) lie in the range of from 5:1 to 1:5. The glass transition temperature of the copolymers can also be manipulated by controlling the ratios of the two monomers. Generally, those copolymers which possess higher amounts of DtBF also have higher Tgs.

Although the primary intent of this specification is to disclose the copolymers composed of DtBF and ATS or ST or BOST as comonomers, this invention may be extended to cover other comonomers as well. Especially attractive are copolymers with aromatic or silicon-containing monomers which contribute to good oxygen plasma resistance. Among the examples of such monomers may be included: vinyl naphthalene, N-vinyl carbazole, 4-vinyl anisole, 4-vinyl toluene, 4-t-butylstyrene, 2-chlorostyrene, 4-bromostyrene, vinyltri-methylsilane, vinyltriethylsilane, 4-tri-methylsilylstyrene, etc. Also if the aromatic ring has a group which is unstable to acid, irradiation is followed by removal of the protecting group to form an alkali soluble polymer, resulting in further improved resolution. Considerations with respect to the ratios of the various comonomers listed here with DtBF are the same as described above.

Accordingly, the present invention provides a photoresist composition comprising a polymer of the following formula (1):

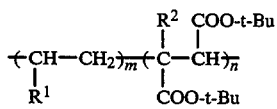

In the formula, $R^1$ is a substituted or unsubstituted aromatic group or $-(CH_2)_p-SiR^3$ wherein $R^3$ is a methyl or ethyl group and p is equal to 0 or 1, $R^2$ is a hydrogen atom or methyl group, t-Bu is a tertiary-butyl group, and $n/(m+n)$ is in the range of from 0.1 to 0.9.

The polymer of formula (1) can form a positive working two-component photoresist composition with a photoacid generator.

The polymer of formula (1) can also be used as an alkali soluble resin and in this regard, form a positive working three-component photoresist composition with a photoacid generator and a dissolution inhibitor having at least one group which is unstable to acid.

Alternatively, the polymer of formula (1) can be used as a dissolution inhibitor and in this regard, form a positive working three-component photoresist composition with another alkali soluble resin and a photoacid generator.

DETAILED DESCRIPTION OF THE INVENTION

The photoresist composition of the invention is comprised of a polymer of the general formula (1).

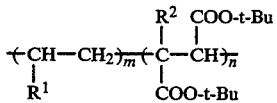

In the formula, $R^1$ is a substituted or unsubstituted aromatic group or $-(CH_2)_p-SiR^3$ wherein $R^3$ is a methyl or ethyl group and p is equal to 0 or 1, $R^2$ is a hydrogen atom or methyl group, t-Bu is a tertiary-butyl group, and $n/(m+n)$ is in the range of from 0.1 to 0.9.

The unsubstituted aromatic groups represented by $R^1$ are preferably those having 6 to 12 carbon atoms, with typical examples shown below.

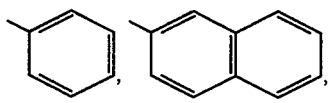

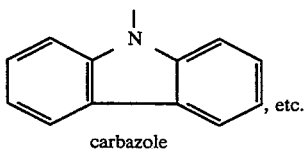

carbazole

The substituted aromatic groups represented by $R^1$ are preferably aromatic groups having 6 to 12 carbon atoms in which some or all of the hydrogen atoms of the aromatic ring are replaced by halogen atoms, alkyl groups having 1 to 10 carbon atoms, alkoxy groups having 1 to 10 carbon atoms, trialkylsilyl groups wherein the alkyl group having 1 to 6 carbon atoms, etc.

Typical examples are given below.

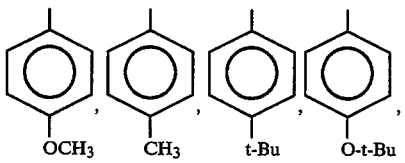

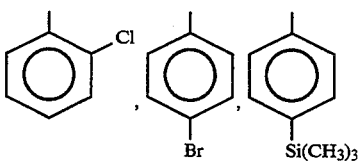

Examples of $-(CH_2)_p-SiR^3$ wherein p is equal to 0 or 1, include $-Si(CH_3)_3$, $-Si(C_2H_5)_3$, and $-CH_2-Si(CH_3)_3$.

The ratio $n/(m+n)$ is in the range of from 0.1 to 0.9, preferably from 0.3 to 0.7. It is this ratio that controls the dissolution rate. The block accompanied by m contributes to an improvement in oxygen plasma resistance and the block accompanied by n improves heat resistance and ensures differential dissolution rate before and after irradiation. More specifically, higher $n/(m+n)$ ratios lead to improved heat resistance and resolution, but detract from oxygen plasma resistance whereas lower $n/(m+n)$ ratios detract from resolution.

The polymer of formula (1) preferably has a molecular weight of 500 to 100,000, more preferably 5,000 to 10,000.

Some preferred examples of the formula (1) polymer are given below.

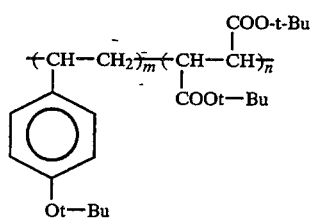

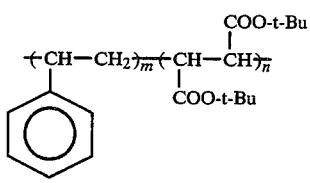

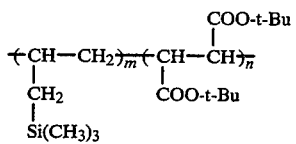

Polymers of these formulas wherein $n/(m+n)=0.1$ to 0.9 have a molecular weight of 500 to 100,000.

The polymer of formula (1) can form a two-component photoresist composition with a photoacid generator. In this regard, polymers of formula (1) wherein $R^1$ is

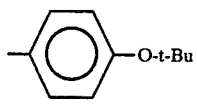

are preferred because this moiety is converted into

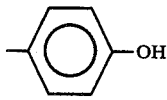

after irradiation, resulting in an increased dissolution rate.

The acid generator may be selected from well-known ones, preferably those of the following formula (2):

$$(R^4)_q MX \qquad (2)$$

wherein $R^4$, which may be identical or different, is independently selected from substituted or unsubstituted aromatic groups, typically a phenyl group. Exemplary substituted aromatic groups are phenyl and other aromatic groups having such a substituent as a linear or branched alkyl group, an alkoxy group, a cycloalkyl group, a haloalkyl group or a halogen atom, the alkyl moiety of these substituents having 1 to 10 carbon atoms. M represents a positively charged sulfur or iodine atom and X is an anion such as p-toluene sulfonate, hexafluoroantimonate, hexafluorophosphate, and trifluoromethane sulfonate, and q is 2 or 3. Preferred onium salts are iodonium and sulfonium salts, examples of which are given below.

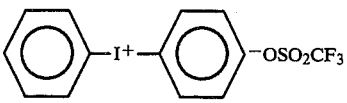

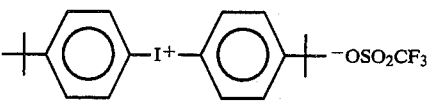

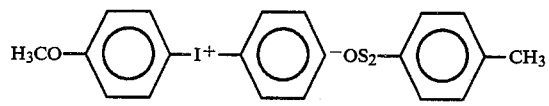

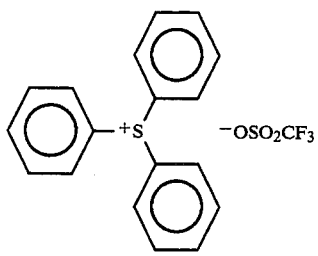

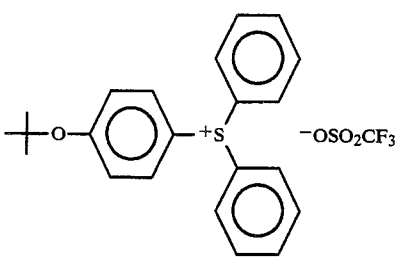

The onium salts used herein are not limited to the examples shown above. There can be used a substance which generates an acid upon exposure to high energy radiation. Examples of the other acid generators include oxime sulfonic acid derivatives, 2,6-dinitrobenzylsulfonic acid derivatives, naphthoquinone-4-sulfonic acid derivatives, 2,4-bistrichloromethyl-6-allyl-1,3,5-triazine derivatives, and α, α'-bisallylsulfonyldiazomethane.

Such photoacid generators are preferably employed in amounts from 0.5 to 20% based on the weight of the polymer of formula (1) (or the solids in the photoresist). More preferably, the amount of photoacid generator lies in the range of 2 to 20%, most preferably 5 to 15% based on the weight of the polymer of formula (1).

Either of the aforementioned two-component resist compositions may be obtained by dissolving the respective components in an organic solvent. Desirable is an organic solvent in which the respective components are fully soluble and which allows for uniform spreading of a resist film. Examples include butyl acetate, xylene, acetone, cellosolve acetate, ethylene glycol monomethyl ether, diethylene glycol monomethyl ether, ethylene glycol monoethyl ether, diethylene glycol dibutyl ether, diethylene glycol dimethyl ether, ethyl lactate, methyl lactate, propyl lactate, and butyl lactate. These organic solvents may be used alone or in admixture of two or more. The amount of the solvent blended is preferably several times the total weight T of the respective components.

In addition to the main components of the photoresist composition described above, there may also be employed surface active agents, wetting agents and coupling agents as part of the invention.

Any of the resist compositions prepared as above may be applied to form a pattern by the following method.

The resist composition in solution form is spin coated onto a substrate, pre-baked, and exposed to high energy radiation whereupon the photoacid generator is decomposed to generate an acid. On baking after exposure, the acid acts as a catalyst for allowing the protective group on the dissolution inhibitor to decompose, losing the dissolution inhibition effect. Subsequent development with an aqueous alkali solution and rinsing with water yields a resist having a positive pattern.

The polymer of formula (1) can be used to form a three-component photoresist composition. The three-component system has advantages of reduced amounts of the dissolution inhibitor, reduced changes of film thickness, and reduced occurrence of bubbles, all contributing to precise fine line processing.

The polymer of formula (1) forms a three-component photoresist composition designated A when it is used as an alkali soluble resin, and another three-component photoresist composition designated B when it is used as a dissolution inhibitor.

Three-component photoresist composition A
  polymer of formula (1)
  photoacid generator
  dissolution inhibitor having at least one acid—unstable group
Three-component photoresist composition B
  alkali soluble resin
  photoacid generator
  polymer of formula (1) as dissolution inhibitor First resist composition A is described. The type and amount of the photoacid generator are the same as described for the two-component resist composition. The dissolution inhibitor which can be used herein may be represented by the following formula.

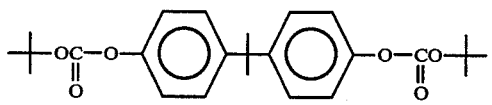

The dissolution inhibitor is preferably blended in an amount of about 7 to 40%, especially about 10 to 30% by weight of the entire composition. Less than 7% of the dissolution inhibitor would be less effective for its purpose whereas more than 40% of the dissolution inhibitor would make it difficult to control solubility after exposure.

Resist composition B uses the polymer of formula (1) as a dissolution inhibitor. By using the polymer of formula (1) as a dissolution inhibitor, there are obtained several advantages including (1) an increased difference in dissolution rate before and after exposure, (2) easy control of the molecular weight and degree of copolymerization allowed by the polymer rather than the monomer, and hence, easy control of solubility, and (3) increased thermal and mechanical strength.

Resist composition B is described in further detail. The alkali soluble resins used herein include polyhydroxystyrene and novolak resins. Polyhydroxystyrene is preferably used since the novolak resins have light absorption in the deep UV region. Preferred polyhydroxy-styrenes are those in which some of their OH groups are replaced by acid unstable groups such as t-butyl or t-butoxycarbonyl groups and have a molecular weight of 5,000 to 100,000. The alkali soluble resin is preferably at least about 55%, especially about 60 to 80% by weight of the total T of the alkali soluble resin, acid generator and dissolution inhibitor which is the polymer of formula (1). Compositions containing less than 55% by weight of the alkali soluble resin would be inefficient to apply or form resist films having low strength.

The photoacid generator may be the same as previously described for the two-component resist composition and used in an amount of about 0.5 to 15% by weight of the total T of the respective components. Compositions containing less than 0.5% by weight of the acid generator still retain positive working resist performance, but would be low in sensitivity. As the amount of acid generator increases, the resist tends to exhibit higher sensitivity and contrast. In excess of 15% by weight of the acid generator, compositions still retain positive resist performance, but no further increase in sensitivity is expected. Since the acid generator is an expensive reagent and an increase of low molecular weight component in the resist would detract from the mechanical strength of resist films, it is recommended to blend the acid generator in amounts of up to 15% by weight.

The polymer of formula (1) as the dissolution inhibitor is preferably blended in an amount of about 7 to 40%, especially 10 to 30% by weight based on the total T of the respective components. Less than 7% of the polymer would be less effective for dissolution inhibition whereas more than 40% of the polymer would make it difficult to control solubility after exposure.

In the three-component resist compositions, solvents, surface active agents, wetting agents and coupling agents may also be used as in the two-component resist compositions.

The method of forming a pattern is substantially the same as explained in the two-component resist composition.

The thus obtained pattern has greater dissolution inhibition effect than the conventional dissolution inhibitor prior to exposure, and subsequent to exposure, the dissolution inhibition effect is lost and solubility is significantly promoted. This ensures increased contrast and high resolution.

The two- or three-component resist composition of the invention as a positive working resist is sensitive to high energy UV radiation, improved in sensitivity, resolution and plasma etch resistance, and produces a resist pattern having improved heat resistance. The pattern is unlikely to be overhanged and is improved in dimensional control. The composition requires post-exposure baking (PEB) during the chemical amplification process, minimizing time dependency of resist properties after exposure, and needs no water during the chemical amplification process, resulting in a simpler system. Thus the resist accommodates for fine processing using electron beams or deep UV beams and has minimized absorption at the exposure wavelengths of a KrF excimer laser, ensuring easy formation of a fine pattern perpendicular to the substrate.

Examples

Examples of the present invention are given below together with synthesis examples by way of illustration and not by way of limitation.

Synthesis 1

Free radical copolymerization of di-tert-butyl fumarate (DtBF) and allyltrimethylsilane (ATS):

A solution of 0.7 g of di-tert-butyl fumarate, 0.42 ml of allyltrimethyl silane and 0.012 g of benzoyl peroxide (BPO) was placed in a glass ampule. The ampule was degased using several freeze-thaw cycles under vacuum. After polymerization for 34 hr. at 80° C., the resulting solid was dissolved in CHCl$_3$ and precipitated into methanol. The polymer was filtered, washed with methanol and dried in a vacuum oven at 60° C. There was obtained 0.62 g (62% yield) of copoly(DtBF-ATS) having Mn=12,300 g/mol, Mw=17,300 g/mol, and a dispersity of Mw/Mn=1.4.

$^1$H—NMR (200 MHz, CDCl$_3$): δ3.2-2.2 ppm

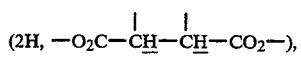

(2H, —O$_2$C—C$\underline{H}$—C$\underline{H}$—CO$_2$—), 1.8-0.5 ppm

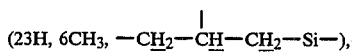

(23H, 6CH$_3$, —C$\underline{H}_2$—C$\underline{H}$—C$\underline{H}_2$—Si—), 0 ppm (9H, —Si—(CH$_3$)$_3$).

Similarly, a series of copolymers were prepared in which the ratio of DtBF to ATS varied from 1:2 to 2:1. These are shown in Table 1.

TABLE 1

Studies of the Copolymerization of DtBF and ATS

| ID | DtBF (mol ratio) | ATS (mol ratio) | BPO (wt %) | Yield (%) | Mn | Mw | Mw/Mn | Comp. ratio | Tg (°C.) |
|---|---|---|---|---|---|---|---|---|---|
| P-1 | 1.2 | 1 | 0.45 | 9 | — | — | — | — | — |
| P-2 | 2 | 1 | 0.45 | 12 | — | — | — | — | — |
| P-3 | 1 | 2 | 1.2 | 50 | 16,360 | 34,000 | 2.1 | 1:1.6 | 127 |
| P-4 | 1 | 1.3 | 1.2 | 58 | 12,120 | 16,500 | 1.4 | 1.7:1 | 136 |
| P-5 | 1.2 | 1 | 1.2 | 62 | 12,270 | 17,300 | 1.4 | 2.6:1 | 139 |
| P-6 | 2 | 1 | 1.2 | 67 | 12,980 | 25,400 | 2.0 | 5.8:1 | >200 |

The glass transition temperatures of the copolymers decrease as the amount of DtBF is decreased. However, the glass transition temperatures shown in Table 1 are sufficiently high for use in photoresist applications.

The copolymer P-5 was selected for further study. The UV absorbance of this polymer at 248 nm in the solid state was determined to be very low (0.083). Films of the copolymer containing 5% by weight of (4-decyloxyphenyl)diphenylsulfonium hexafluoroantimonate as the photoacid generator were subjected to oxygen plasma etch studies. An etch rate of 1196 Å/min. was obtained whereas poly(di-t-butylfumarate) had an etch rate of 4282 Å/min. Dry etching was performed on a plasma etching machine (Technics Planar Etch II) under CF$_4$ gas (containing 5% oxygen) at 350 mtorr and 200 W. The remaining film thickness was measured using a Nanometrics Nanospec/AFT apparatus.

Synthesis 2

Free radical copolymerization of di-tert-butyl fumarate (DtBF) and styrene (ST):

A solution of 0.7 g of di-tert-butyl fumarate, 0.33 ml of styrene and 0.01 g of benzoyl peroxide (BPO) were placed in a glass ampule. The ampule was degassed by repeated freeze-thaw cycles under high vacuum. After polymerization for 6 hr. at 80° C., the resulting solid reaction mixture was dissolved in toluene and precipitated into methanol. The polymer was recovered by filtration and washed with methanol and dried in a vacuum oven at 60° C. There was obtained 0.57 g (57%) of copoly(DtBF-ST) having a Mn=24,300 g/mol, Mw=66,730 g/mol, and a polydispersity index (Mw/Mn) of 2.7.

$^1$H—NMR (200 MHz, CDCl$_3$): δ3.7-2.2 ppm

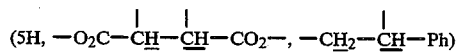

(5H, —O$_2$C—C$\underline{H}$—C$\underline{H}$—CO$_2$—, —C$\underline{H}_2$—C$\underline{H}$—Ph)

1.8-0.5 ppm (18H, 6CH$_3$),
7.3-6.5 ppm (5H, phenyl)

Using similar procedures, a series of polymers were prepared where the ratio of DtBF to ST was varied from 4.1:1 to 1:1.5 (Table 2). The composition ratios of copolymers were determined by elemental analysis.

TABLE 2

Studies of the Copolymerization of DtBF and ST

| ID | DtBF (mol ratio) | ST (mol ratio) | BPO (wt %/ monomer) | Rxn time (hr) | Yield (%) | Mn | Mw | Mw/Mn | Comp. ratio | Tg (°C.) |
|---|---|---|---|---|---|---|---|---|---|---|
| S-1 | 4.1 | 1 | 0.5 | 6 | 50 | 27,600 | 51,400 | 1.9 | 3.76-1 | 162 |
| S-2 | 4.1 | 1 | 0.1 | 6 | 15 | 41,000 | 113,600 | 2.8 | — | — |
| S-3 | 4.1 | 1 | 1 | 6 | 98 | 25,900 | 63,200 | 2.4 | — | — |
| S-4 | 4.1 | 1 | 0.5 | 4 | 33 | 29,300 | 52,800 | 1.8 | — | — |
| S-5 | 1.1 | 1 | 0.5 | 4 | 35 | 28,900 | 64,900 | 2.3 | — | — |
| S-6 | 1.1 | 1 | 0.5 | 6 | 47 | 29,700 | 66,000 | 2.2 | — | — |
| S-7 | 1.1 | 1 | 1 | 6 | 57 | 24,300 | 66,700 | 2.7 | 1-1.38 | 134 |
| S-8 | 1 | 1.5 | 1 | 6 | 56 | 26,300 | 65,300 | 2.5 | 1-1.56 | 128 |

The copolymer S-5 was selected for further study. Films of the above copolymer were subjected to oxygen plasma etching as described above. An etch rate of 964 Å/min. was obtained.

Synthesis 3

Free radical copolymerization of di-t-butylfumarate (DtBF) and 4-t-butoxystyrene (BOST):

A solution of 0.7 g of di-t-butyl-fumarate, 0.55 ml of 4-t-butoxystyrene and 0.01 g benzoyl peroxide (BPO) was placed in a glass ampule. The ampule was degassed using several freeze-thaw cycles under high vacuum.

After polymerization for 10 hr. at 80° C., the resulting solid was dissolved in acetone and precipitated into methanol. The polymer was filtered, washed with methanol and dried in a vacuum oven at 60° C. There was obtained 0.48 g (38.4% yield) of copoly(DtBF-BOST) having Mn=25,100 g/mol. Mw=67,700 g/mol and a dispersity of Mw/Mn=2.7.

¹H—NMR (200 MHz, CDCl₃): δ3.7–2.2 ppm

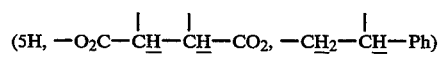

(5H, —O₂C—CH—CH—CO₂, —CH₂—CH—Ph)

1.8–0.5 ppm (27H, 9CH₃)
7.3–6.5 ppm (4H, phenyl)

Similarly, a series of copolymers were prepared in which the ratio of DtBF to BOST was varied from 4.1:1 to 1:1 (Table 3). The composition ratio of copolymers was determined by elemental analysis.

TABLE 3

| | Studies of the copolymerization of DtBF and BOST | | | | | | | | |
|---|---|---|---|---|---|---|---|---|---|
| ID | DtBF (mol ratio) | BOST (mol ratio) | BPO (wt %) | Yield (%) | Mn | Mw | Mw/Mn | Comp. ratio | Tg (°C.) |
| B-1 | 4.1 | 1 | 1 | 47.2 | 27100 | 53200 | 2.0 | — | — |
| B-2 | 2 | 1 | 1 | 35.0 | 25400 | 62200 | 2.5 | 1:1.1 | — |
| B-3 | 1 | 1 | 1 | 38.4 | 25100 | 67700 | 2.7 | 1:1.27 | 118 |

Copolymer B-3 was selected for further study.

Films of the copolymer were subject to oxygen plasma etching as described above. An etch rate of 998 Å/min. was obtained.

Example 1
Photoimaging and Lithographic Evaluation:

Copoly(DtBF-ATS) (P-5) was dissolved in chlorobenzene to make a 18 wt % solution to which was added (4-decyloxyphenyl)diphenyl-sulfonium hexafluoroantimonate (5 wt % based on total solids). The solution was filtered through 0.2 μm filters (Scientific Resources Inc.). The resist solutions were spin coated to a thickness of 1 μm onto silicon wafers and soft baked at 80° C. for 30 min. The resist films were exposed using a Cymer KrF excimer laser stepper at 248 nm with a numerical aperture of 0.45. After a post-exposure bake (PEB) at 120° C., the resist films were developed by immersion in an aqueous base developer (1:1 MF-312 from Shipley Co.). The following sensitivity, contrast and resolution results were obtained.

TABLE 4

| PEB (°C./min.) | Sensitivity (mJ/cm²) | Contrast | Resolution (μM) |
|---|---|---|---|
| 120/10 | 1 | 6.67 | 1.5 |
| 120/5 | 4 | 4.55 | — |

As noted in Table 4, this photoresist displays extraordinarily high sensitivity indicative of a chemical amplification process. It also has good resolution and high contrast indicating that the profile of the imaged photoresist is very sharp.

Example 2
Photoimaging and Lithographic Evaluation of copoly (DtBF-ST)

A photoresist was prepared by dissolving copoly(DtBF-ST) (S-5) into cyclohexanone to give a 18 wt % solution. There was added 5 wt % (4-decyloxyphenyl)diphenylsulfonium hexa-fluoroantimonate as the photoacid generator. The solution was filtered through 0.2 μm filters (Scientific Resources Inc.). The resist solution was spin coated onto silicon wafers to give a film of 1 μm in thickness and soft baked at 80° C. for 30 min. The resist films were imaged using a Cymer KrF excimer laser stepper at 248 nm with a numerical aperture of 0.45. After a post-exposure bake (PEB) at 120° C., the resist films were developed in an aqueous base developer (1:1 MF-312 from Shipley Co.). The following sensitivity, contrast and resolution results were obtained.

TABLE 5

| PEB (°C./min.) | Sensitivity (mJ/cm²) | Contrast | Resolution (μM) |
|---|---|---|---|
| 120/1 | 10 | 6.67 | 1.0 |
| 120/5 | 7 | 5.26 | — |
| 120/10 | 4 | 3.85 | — |
| 100/10 | 13 | 9 | — |

This polymer shows an excellent combination of good sensitivity and resolution with high contrast.

Example 3
Photoimaging and Lithographic Evaluation of copoly(DtBF-BOST)

A photoresist was prepared by dissolving copoly(DtBF-BOST) into cyclohexanone to give a 18 wt % solution. There was added 5 wt % (4-decyloxyphenyl)diphenylsulfonium hexafluoro-antimonate as the photoacid generator. The solution was filtered through 0.2 μm filters (Scientific Resources Inc.). The resist solution was spin coated onto silicon wafers to give a film of 1 μm in thickness and soft baked at 80° C. for 30 min. The resist films were imaged using a Cymer KrF excimer laser stepper at 248 nm with a numerical aperture of 0.45. After a post-exposure bake (PEB) at 120° C., the resist films were developed in an aqueous base developer (1:1 MF-312 from Shipley Co.). The following sensitivity, contrast and resolution results were obtained.

TABLE 6

| PEB (°C./min.) | Sensitivity (mJ/cm²) | Contrast | Resolution (μM) |
|---|---|---|---|
| 120/10 | 2 | 6.68 | 2.0 |
| 120/5 | 6 | 4.4 | — |

As noted in Table 6, this photoresist displays extraordinarily high sensitivity indicative of a chemical amplification process. It also has good resolution and high contrast indicating that the profile of the imaged photoresist is very sharp.

Example 4
Photoimaging and Lithographic Evaluation of copoly (DtBF-BOST)

A photoresist was prepared by dissolving copoly (DtBF-BOST) and bis-2,2-(4,4'-butoxycarbonyloxyphenyl)propane as the dissolution inhibitor into 1-acetoxy-2-ethoxypropane to give a 18 wt % solution. There was added 5 wt % (4-decyloxyphenyl)diphenylsulfonium hexafluoroantimonate as the photoacid generator. The solution was filtered through 0.2 μm filters (Scientific Resources Inc.). The resist solution was spin coated onto silicon wafers to give a film of 1 μm in thickness and soft baked at 80° C. for 30 min. The resist films were imaged using a Cymer KrF excimer laser stepper at 248 nm with a numerical aperture of 0.45. After a post-exposure bake (PEB) at 120° C., the resist films were developed in an aqueous base developer (1:1 MF-312 from Shipley Co.). The following sensitivity, contrast and resolution results were obtained.

TABLE 7

| PEB (°C./min.) | Sensitivity (mJ/cm²) | Contrast | Resolution (μm) |
|---|---|---|---|
| 120/10 | 1 | 7.2 | 2.1 |

Example 5

A resist solution contained the following components.

| | Parts by weight |
|---|---|
| Base resin: | |
| partially t-butoxycarbonylated polyhydroxystyrene (t-butoxycarbonylation 20.0%) | 90 |
| Dissolution inhibitor: | |
| Copolymer of Synthesis 3 (DtBF-BOST) | 6.0 |
| Photoacid generator: | |
| Triphenylsulfoniumtriflate | 4.0 |
| Solvent: | |
| Diethylene glycol dimethyl ether | 500 |

The resist solution was spin coated onto a silicon wafer at 2,000 rpm and soft baked on a hot plate at 100° C. for 2 minutes. The film was 0.95 μm thick. The resist film was exposed imagewise using a KrF excimer laser and then baked at 80° C. for 1 minute. Then the film was developed with an aqueous solution of 2.38% tetramethylammonium hydroxide (TMAH) for 1 minute and rinsed with water for 30 seconds.

The resulting pattern was of the positive type and the resist film had a sensitivity of 10.0 mJ/cm² (Eth value). The pattern had a line and space pattern resolution of 0.25 μm, a whole pattern resolution of 0.3 μm, and vertical side walls.

We claim:

1. A photoresist composition comprising a polymer of the following formula (1):

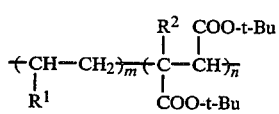
(1)

wherein $R^1$ is a substituted or unsubstituted aromatic group or $-(CH_2)_p-SiR^3$ wherein $R^3$ is a methyl or ethyl group and p is equal to 0 or 1, $R^2$ is a hydrogen atom or methyl group, t-Bu is a tertiary-butyl group, and $n/(m+n)$ is from 0.1 to 0.9, in admixture with a photoacid generator.

2. The photoresist composition of claim 1 wherein the polymer of formula (1) has a molecular weight of 500 to 100,000 and the following formula:

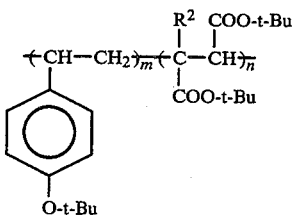

wherein $R^2$, t-Bu and $n/(m+n)$ are as defined in formula (1).

3. The photoresist composition of claim 1 wherein the polymer of formula (1) has a molecular weight of 500 to 100,000 and the following formula:

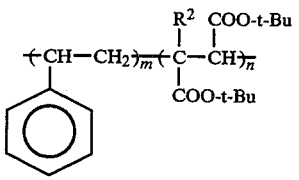

wherein $R^2$, t-Bu and $n/(m+n)$ are as defined in formula (1).

4. The photoresist composition of claim 1 wherein the polymer of formula (1) has a molecular weight of 500 to 100,000 and the following formula:

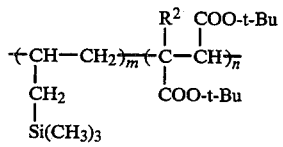

wherein $R^2$, t-Bu and $n/(m+n)$ are as defined in formula (1).

5. The photoresist composition of claim 1 which further comprises a dissolution inhibitor having a group which is unstable to an acid.

6. A photoresist composition of claim 1, further comprising
   (A) an alkali-soluble polymer, wherein the polymer of formula (1) is a dissolution inhibitor.

7. The photoresist composition of claim 6 wherein the alkali-soluble polymer is a polyhydroxystyrene having a molecular weight of 5,000 to 100,000 in which the hydroxyl groups thereof are partially substituted with a group which is unstable to an acid.

8. The photoresist composition of claim 1 wherein, in the polymer of formula (1), $R^1$ is a group $-(CH_2)_p-SiR^3$ wherein p is equal to 0 or 1, or is a phenyl, naphthyl or carbazole aromatic group in which some or all of the hydrogen atoms of the aromatic ring are optionally substituted by halogen atoms, alkyl groups of 1 to 10 carbon atoms, alkoxy groups of 1 to 10 carbon atoms or trialkylsilyl groups wherein the alkyl groups are of 1 to 6 carbon atoms.

9. The photoresist composition of claim 1 wherein, in the polymer of formula (1), $n/(m+n)$ is from 0.3 to 0.7.

10. The photoresist composition of claim 1, wherein the polymer of formula (1) has a molecular weight of 5,000 to 10,000.

11. The photoresist composition of claim 1, wherein the photoacid generator is of the formula (2):

$(R^4)_q MX$       (2)

wherein each $R^4$ is independently a substituted or unsubstituted aromatic group, M is a positively charged sulfur or iodine atom, X is an anion and q is a number 2 or 3.

12. The photoresist composition of claim 11, wherein in the photoacid generator of the formula (2) $R^4$ is a phenyl group optionally substituted with an alkyl, alkoxy, cycloalkyl or haloalkyl group of 1 to 10 carbon atoms or a halogen atom and X is a p-toluenesulfonate, hexafluoroantimonate, hexafluorophosphate or trifluoromethane sulfonate anion.

13. The photoresist composition of claim 1, wherein the photoacid generator is present in an amount of 0.5 to 20% by weight based on the weight of the polymer of formula (1).

14. The photoresist composition of claim 5, wherein the dissolution inhibitor is a compound of the following formula:

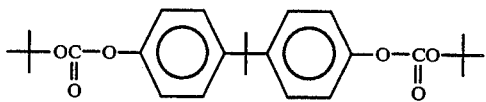

15. The photoresist composition of claim 14, wherein the dissolution inhibitor is present in an amount of 7 to 40% by weight of the entire composition.

16. The photoresist composition of claim 6, which comprises at least about 55% by weight of the alkali-soluble polymer, 0.5 to 15% by weight of the photoacid generator and 7 to 40% by weight of the polymer of formula (1).

* * * * *